(12) United States Patent
Tsurusaki

(10) Patent No.: US 6,443,355 B1
(45) Date of Patent: Sep. 3, 2002

(54) SOLDERING METHOD AND APPARATUS

(75) Inventor: Arata Tsurusaki, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/710,389

(22) Filed: Nov. 9, 2000

(30) Foreign Application Priority Data

Nov. 10, 1999 (JP) ............................................ 11-320263

(51) Int. Cl.⁷ .......................... B23K 31/02; B23K 35/38
(52) U.S. Cl. ....................... 228/222; 228/46; 228/180.1
(58) Field of Search ........................... 228/180.22, 200, 228/214, 222, 46, 180.1, 180.21

(56) References Cited

U.S. PATENT DOCUMENTS

| | | | | |
|---|---|---|---|---|
| 5,433,819 A | * | 7/1995 | McMeen | |
| 5,567,151 A | * | 10/1996 | Mizoguchi et al. | |
| 5,921,462 A | * | 7/1999 | Gordon | |
| 6,008,476 A | * | 12/1999 | Neiconi et al. | |
| 6,010,061 A | * | 1/2000 | Howell | |
| 6,123,247 A | * | 9/2000 | Shibo et al. | |
| 6,131,793 A | * | 10/2000 | Howell | |
| 6,145,734 A | * | 11/2000 | Taniguchi et al. | |
| 6,267,288 B1 | * | 7/2001 | Chung | |
| 6,278,051 B1 | * | 8/2001 | Peabody | |

FOREIGN PATENT DOCUMENTS

| | | | |
|---|---|---|---|
| JP | 405183265 A | * | 7/1993 |
| JP | 02000022325 A | * | 1/2000 |

* cited by examiner

*Primary Examiner*—M. Alexander Elve
*Assistant Examiner*—Kiley Stoner
(74) *Attorney, Agent, or Firm*—Frommer Lawrence & Haug LLP; William S. Frommer; Matthew K. Ryan

(57) ABSTRACT

A soldering method and apparatus in which there is provided a tight contact cover tightly contacting a portion (unused portion) of a re-flow panel other than its portion facing a substrate to be soldered in such a manner as to suppress a hot wind tending to turn around to a part setting surface to diminish the thermal energy loss as well as to prevent the circuit quality from being lowered by the solder.

8 Claims, 10 Drawing Sheets

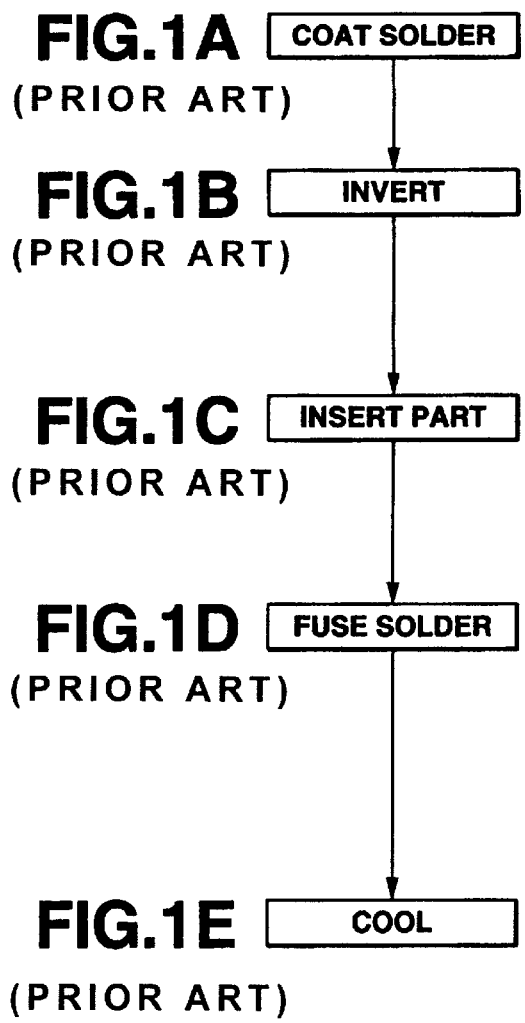
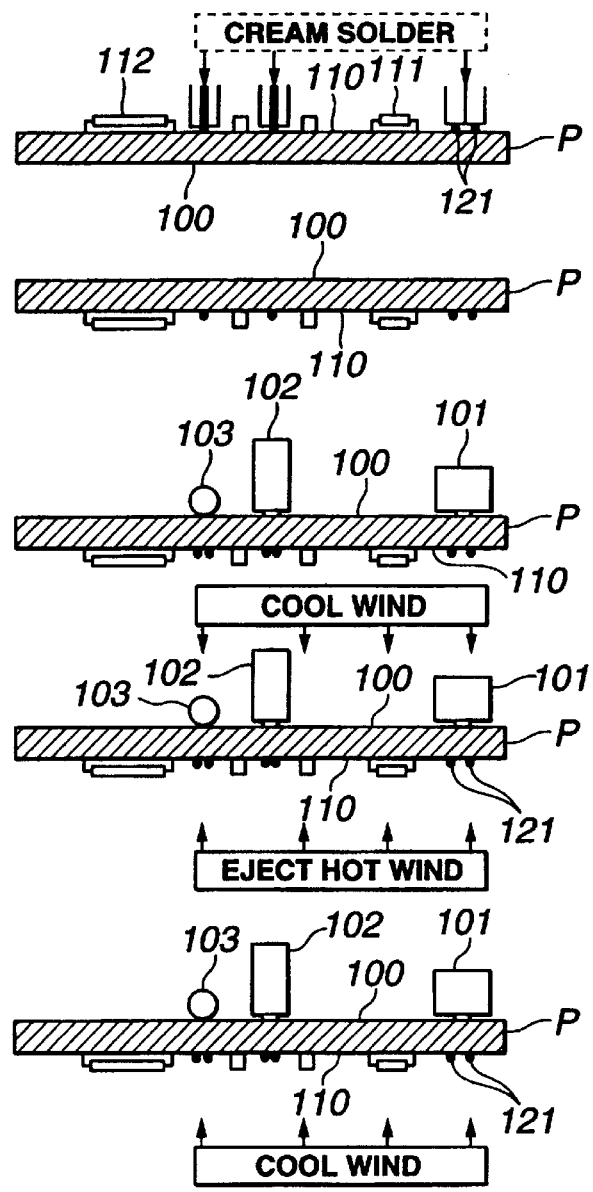
FIG. 1A (PRIOR ART) COAT SOLDER
FIG. 1B (PRIOR ART) INVERT
FIG. 1C (PRIOR ART) INSERT PART
FIG. 1D (PRIOR ART) FUSE SOLDER
FIG. 1E (PRIOR ART) COOL

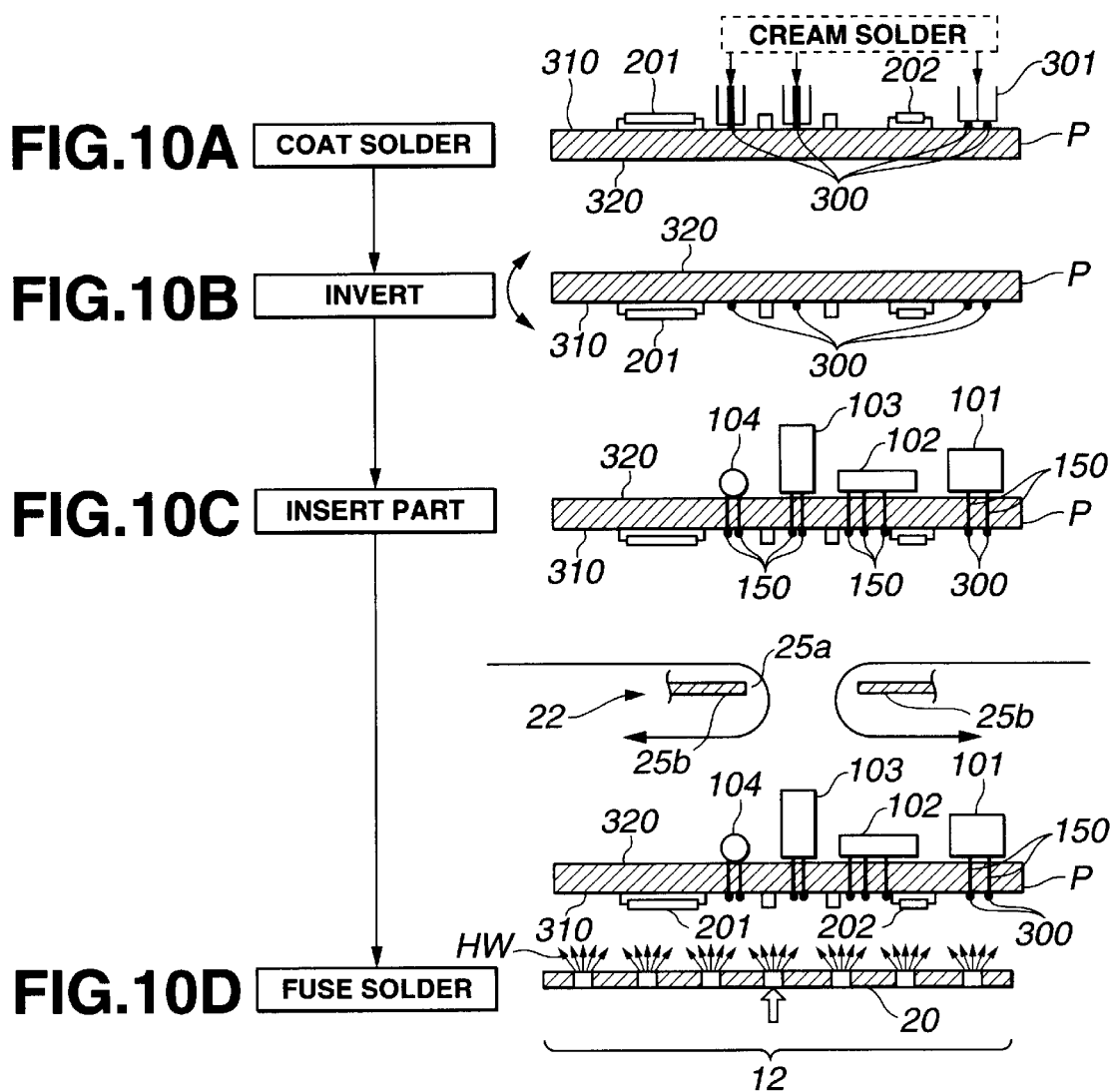

SOLDERING METHOD AND APPARATUS

BACKGROUND OF THE INVENTION

1. Field of the Invention

This invention relates to a soldering method and apparatus for electrically connecting parts loaded on a substrate to the substrate.

2. Description of the Related Art

On a substrate carrying a variety of circuits of an electronic equipment, such as a printed wired board, there are mounted electronic parts making up the circuits. These electronic parts are mounted by insertion, as in the case of lead parts, or by surface mounting, as in the case of chips. The electronic parts, so mounted, are electrically connected on the printed wired board by soldering. As soldering systems, there are a flow soldering system and a re-flow soldering system.

In the flow soldering system, a printed wired board is passed through a soldering vessel containing a fused solder. In the re-flow soldering system, cream solder, for example, is coated on a pre-set site of the printed wired board and, after mounting the chip, the soldering portion of the printed wired board is heated in a re-flow furnace.

Non-heat-resistant electronic parts, such as lead parts of transformers, variable resistor, air-core coil or a chemical capacitor, are soldered by flow soldering to the printed wired board, whereas heat-resistant electronic parts, such as chip parts of resistors, capacitors or IC packages, are soldered by re-flow soldering to the printed wired board.

Usually, the non-heat-resistant electronic parts, that is electronic parts that can be soldered by the flow soldering system, and the heat-resistant electronic parts, that cannot be soldered satisfactorily unless the re-flow soldering system is used, are soldered to a sole printed wired board to improve productivity as well as to achieve size reduction.

This applies when, for example, a tuner circuit for a high frequency portion of a TV receiver and an IF circuit are constructed on a sole printed wired board. It is therefore necessary to use the flow soldering system or a re-flow soldering system depending on the type of the electronic parts to be mounted on the sole printed wired board.

FIG. 1 shows a typical process for conventional re-flow soldering. Referring to FIG. 1A, on an upper surface 110 of a printed wired board P, there are already mounted chip parts 111, 112 as heat-resistant electronic parts, by re-flow soldering. First, to a lead land of the upper surface 110 of the printed wired board P, cream solder 121 is applied, using a multiple dispenser (nozzle). Then, as shown in FIG. 1Bm the printed wired board P is inverted upside down and lead parts 101, 102 and 103, as non-heat-resistant electronic parts, are mounted on the upper surface 100 of the printed wired board P.

The printed wired board P is then charged into the re-flow furnace and hot air is injected on to the lower surface 110, that is the part soldering surface, of the printed wired board P, as shown in FIG. 1D, to fuse the cream solder 121 under heating, at the same time as cold air is blown onto an upper surface 100, that is a part setting surface, to cool the lead parts 101 to 103. Then, cool air is blown onto the soldering surface 110, as shown in FIG. 1E, to cool and cure the cream solder 121 to solder respective connection terminals 120 of the lead parts 101 to 103.

However, in the above-described re-flow furnace, the part setting surface 100 is cooled by cool air during the solder fusing process (re-flow zone). So, the lead parts 101 to 103 are already cooled before start of the cooling process. Since only the part soldering surface 110 is cooled with cool air, remaining heat of the part soldering surface 110 is transmitted to the part setting surface 100, with the result that the lead parts 101 to 103 are heated abnormally as indicated in portion A of FIG. 2. So, the lead parts 101 to 103 as non-heat-resistant parts tend to be lowered in reliability.

There is also known a re-flow furnace having cooling means for efficiently cooling the non-heat-resistant parts loaded on the substrate to prevent the parts from being damaged by heat hysteresis by cooling the part setting surface 100 with a weak wind.

Meanwhile, the above-described re-flow furnace is constructed so that hot air for heating is ejected to a printed wired board P, transported by a conveyor 130, through an opening, not shown, provided in a re-flow panel 131 mounted facing the part setting surface 110 of the printed wired board P, as shown in FIG. 3A, onto the part setting surface 110 so as to be discharged via a vent port 132.

An upper portion of a rear area of the re-flow panel 131 not facing the printed wired board P, there is provided a cover 133 for shielding hot air from the opening of the re-flow panel 131 not contributing to the heating of the printed wired board P.

However, in the above-described soldering apparatus (re-flow furnace), part of hot air ejected via a hole in the re-flow panel 131, that is hot air from an area (unused portion) not facing the printed wire board P, is allowed to flow around the cover 133, without contributing to the heating of the printed wiring board P, and is then directed to the part setting setting surface 100 of the printed wiring board P. On the other hand, the forward side of the re-flow panel 131 not facing the printed wiring board P is devoid of the cover 133 so that it is always exposed to the ejected hot air. The result is that the non-heat-resistant parts on the side part setting surface is also heated by the hot air HW, as shown in FIG. 3B, to lower the part cooling effect, while the thermal energy is wasted to lower the heating efficiency by re-flow panel 131.

So, if a printed wired board is small in size but is loaded with a part with significant thermal load, as in the case of a printed wired board comprised of a tuner of the high frequency device for the TV receiver and the IF circuit, the power falls short such that soldering defects tend to be produced.

Thus, there is raised such a problem that, due to the above-mentioned thermal energy loss or the lowered part cooling effect, reliability of the non-heat-resistant parts tend to be lost or the soldering quality tends to be lowered to render it necessary to execute additional soldering.

SUMMARY OF THE INVENTION

It is therefore an object of the present invention to provide a soldering method and apparatus in which the hot air may be prevented from being directed to the part setting surface to reduce the heat energy loss without detracting from the circuit quality by soldering.

In one aspect, the present invention provides a soldering apparatus in which, for electrically connecting a non-heat-resistant part loaded on a substrate, a part soldering surface side of the substrate is heated by a re-flow unit. The soldering apparatus includes a re-flow panel of the re-flow unit having holes for ejecting a hot wind towards a soldering surface of the substrate, and a tight contact cover intimately contacting the re-flow panel except a portion thereof facing the substrate to be soldered.

In another aspect, the present invention provides a soldering method in which a solder is coated on a substrate, the substrate is inverted upside down, a non-heat-resistant part is loaded on the substrate and a soldering surface for the part of the substrate is heated by a re-flow unit, in which the method includes using a re-flow panel of the re-flow unit having holes through which a hot air is ejected towards the soldering surface of the substrate, and arranging a tight contact cover intimately contacting the re-flow panel except a portion thereof facing the substrate to be soldered to prohibit ejection of the hot wind through the holes.

According to the present invention, the holes in the portion of re-flow panel of the re-flow unit, other than the panel portion facing the substrate to be soldered, are tightly closed by the tight contact cover. So, the holes in the portion of the re-flow panel not facing the substrate, that is the unused portion, are closed, such that the hot wind not contributing to the heating of the part soldering surface of the substrate is not ejected from the re-flow panel.

Since there is no risk of the hot wind turning around to the part setting surface of the substrate, the loaded part is not heated by the hot wind to prevent the part from being affected in reliability. On the other hand, the thermal energy loss is diminished to improve the substrate heating efficiency by the re-flow panel. There is no risk of the occurrence of power shortage even if the printed wired board P is to be subjected to a high thermal load as in case the printed wired board is comprised of the tuner circuit of the high frequency device for TV receiver and an IF circuit. Thus, the part soldering surface of the printed wired board may be heated sufficiently to assure reliable soldering.

So, according to the soldering method and apparatus according to the present invention, the hot wind may be prevented from turning around to the part setting surface to suppress thermal energy loss without detracting from the circuit quality.

BRIEF DESCRIPTION OF THE DRAWINGS

FIG. 1 shows a typical conventional soldering method, step-by-step.

FIG. 10 shows the process of an embodiment of a soldering method according to the soldering apparatus of FIG. 4, step by step.

DESCRIPTION OF THE PREFERRED EMBODIMENTS

Referring to FIGS. 4 to 11, preferred embodiments of the present invention will be explained in detail.

In the following embodiments, a variety of technically desirable limitations are imposed, since these embodiments represent preferred forms of execution of the present invention. However, the present invention is not limited to these embodiments in the absence of limiting statements.

Figure 2:
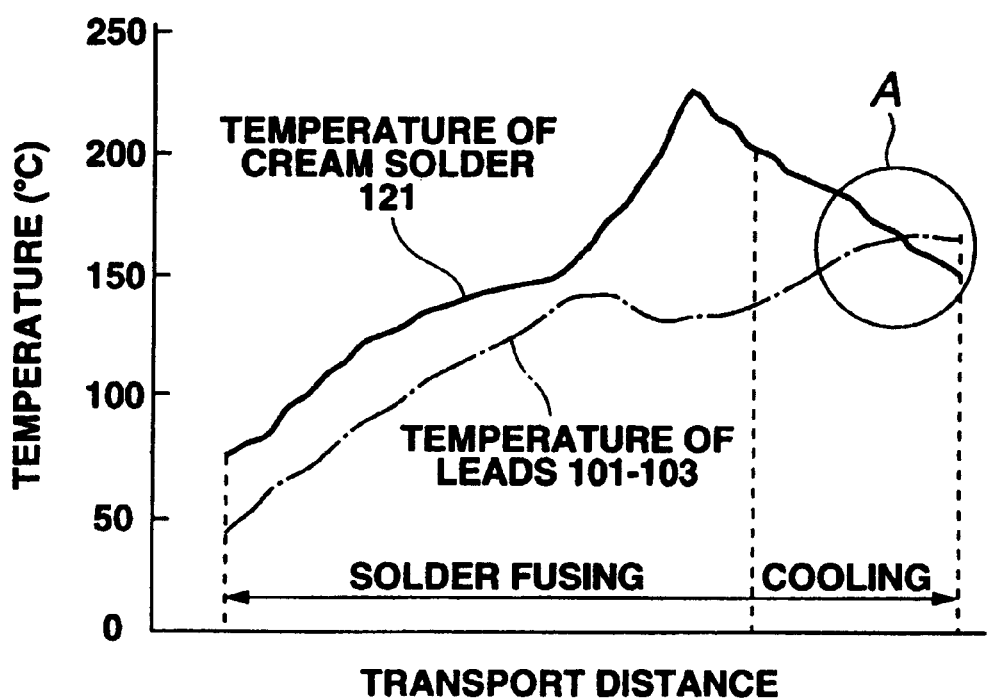
FIG. 2 is a graph showing temperature changes in the solder and parts by the soldering method of FIG. 1.
Figure 3A:
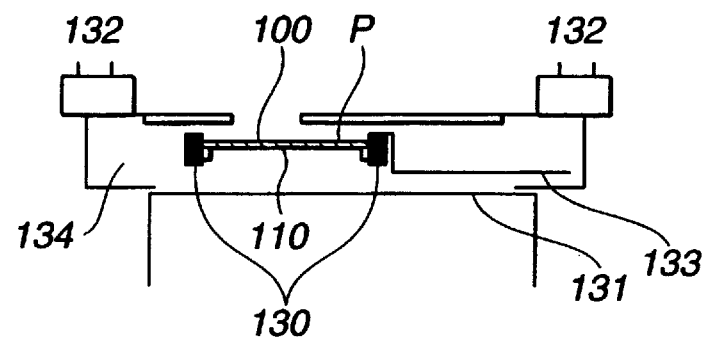
FIG. 3A is a cross-sectional view showing the relation between the re-flow panel and the printed wired board in a conventional soldering apparatus.
Figure 3B:
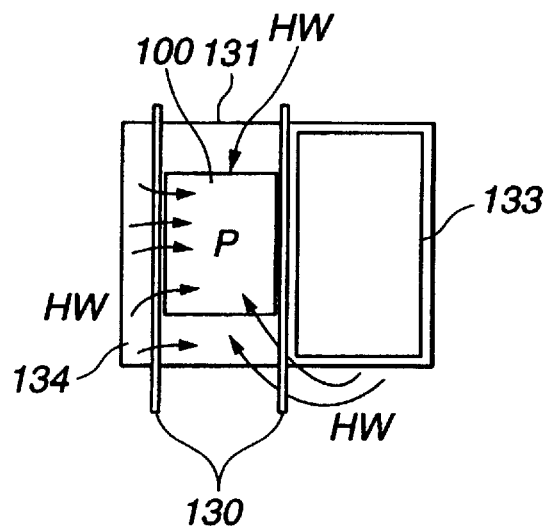
FIG. 3B is a plan view showing the relation between the re-flow panel and the printed wired board in a conventional soldering apparatus.
Figure 4:
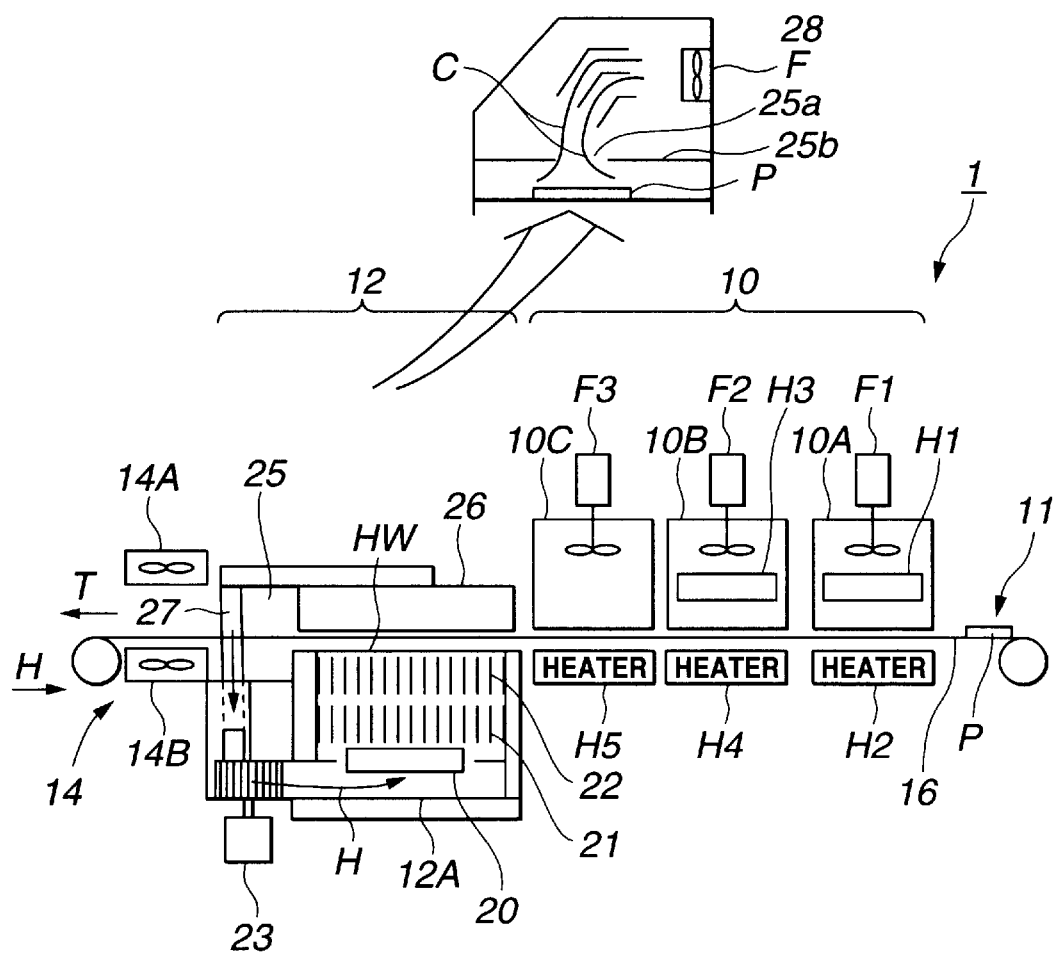
FIG. 4 is a schematic view showing the structure of an embodiment of the soldering apparatus according to the present invention.

FIG. 4 shows the structure of an embodiment of the soldering apparatus embodying the present invention.

In FIG. 4, a soldering apparatus 1 is used as a re-flow furnace and is comprised of a pre-heating unit 10, a re-flow unit 12 and a cooling unit 14, interconnected by a conveyor 16. That is, the pre-heating unit 10, re-flow unit 12 and the cooling unit 14 are sequentially arranged along the flowing direction of the conveyor 16, that is in the right-to-left direction in FIG. 4. This allows the printed wired board P carrying the variable parts to be conveyed from an inlet 11 through the pre-heating unit 10, re-flow unit 12 and the cooling unit 14 so as to be discharged as indicated by arrow T.

Figure 5:
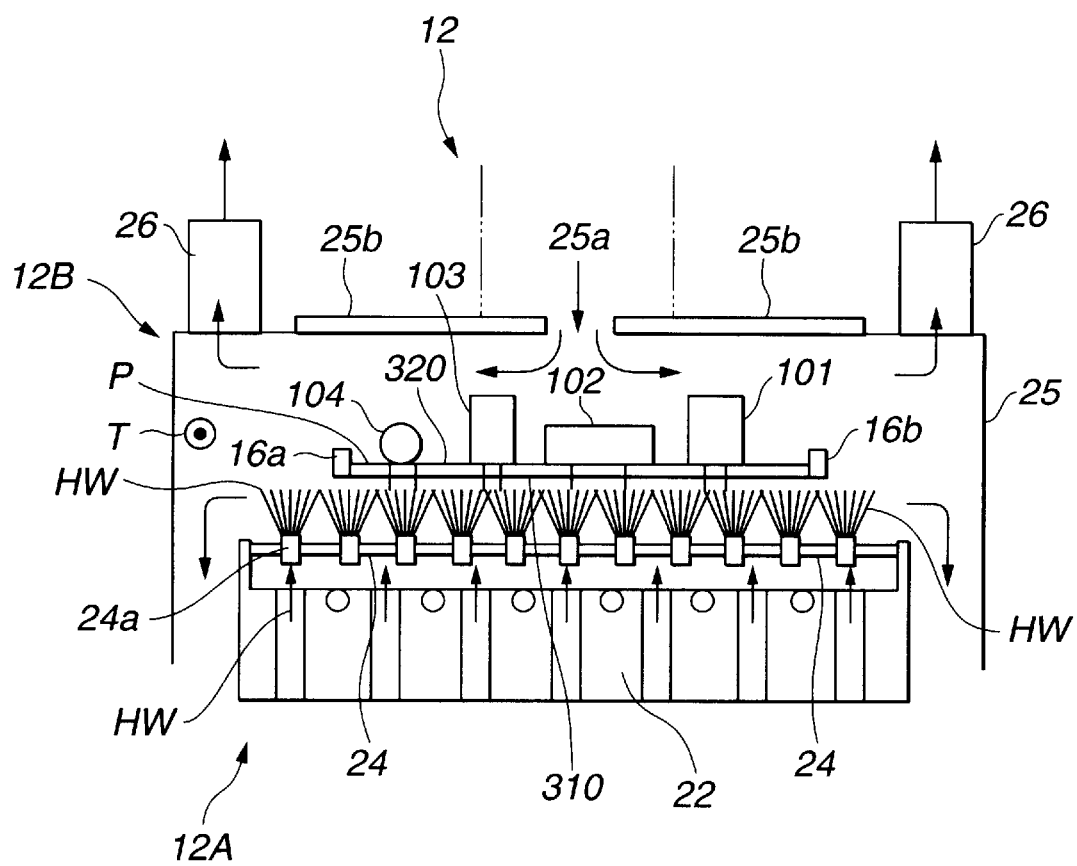
FIG. 5 is an enlarged cross-sectional view of a re-flow unit of the soldering apparatus of FIG. 4, looking along a direction transverse to the substrate transporting direction.

In FIG. 5, the conveyor 16 is arranged ahead and at back of the printed wired board P to hold the printed wired board, that is on the forward and back sides thereof. The forward side conveyor 16a is fixed, whereas the rear side conveyor 16b is adjustable in its position depending on the width of the printed wired board P to be soldered.

First, the structure of the pre-heating unit 10 is explained.

This pre-heating unit 10, preliminary heating the printed wired board P, includes a first pre-heating unit 10A, a second pre-heating unit 10B and a third pre-heating unit 10C. The first pre-heating unit 10A includes heaters H1, H2 and a circulating fan F1, whilst the second pre-heating unit 10B includes heaters H3, H4 and a circulating fan F2. The third pre-heating unit 10C includes one heater H5 and a circulating fan F3. The heaters H1, H3 are arranged above the conveyor 16, whilst the heaters H2, H4 and H5 are arranged below the conveyor 16. The circulating fans F1 to F3 furnish air to the respective heaters to circulate hot air.

The pre-heating unit 10, described above, is configured for gradually heating the printed wired board P in three stages for raising the temperature of the printed wired board P from ambient temperature to a pre-set temperature. This permits the solder to be activated without stressing the printed wired board P and the electronic parts loaded thereon.

Referring to FIGS. 4 to 7, the structure of the re-flow unit 12 is hereinafter explained.

Figure 6:
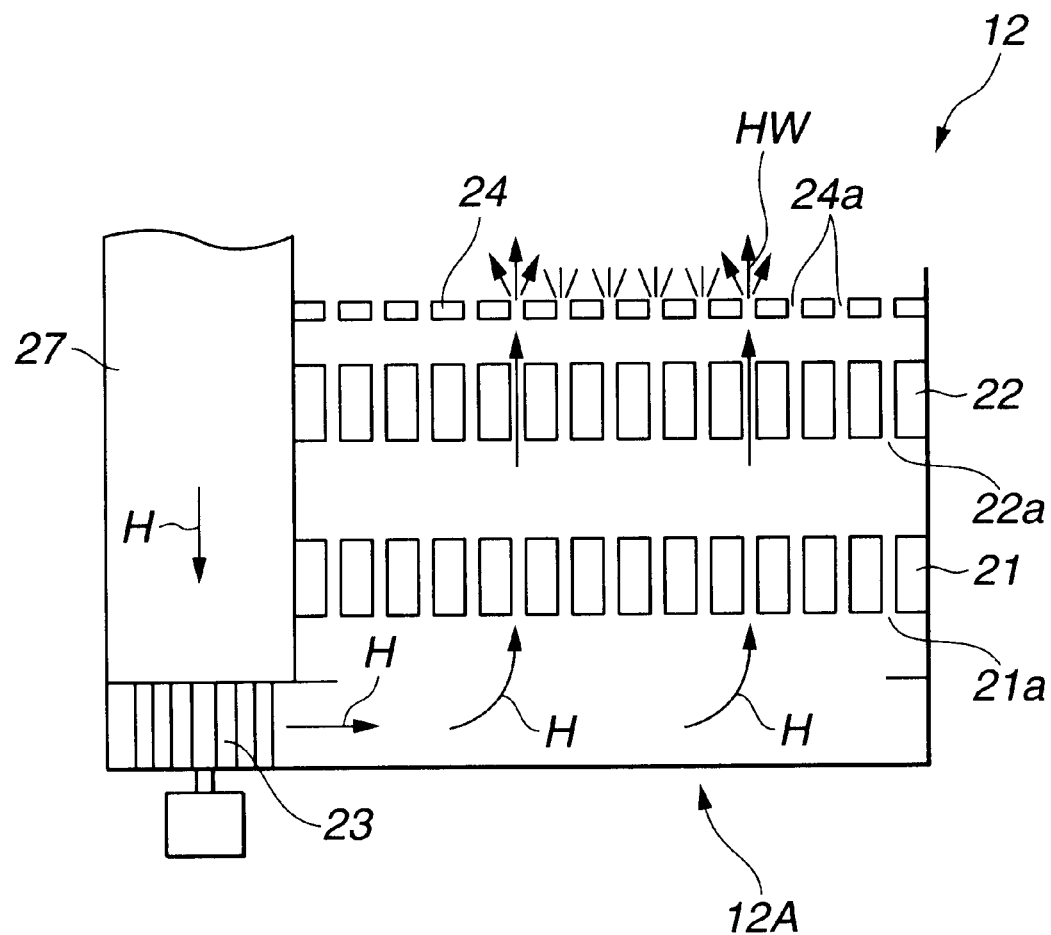
FIG. 6 is an enlarged cross-sectional view of the re-flow unit of the soldering apparatus of FIG. 4, looking along the substrate transporting direction.
Figure 7:
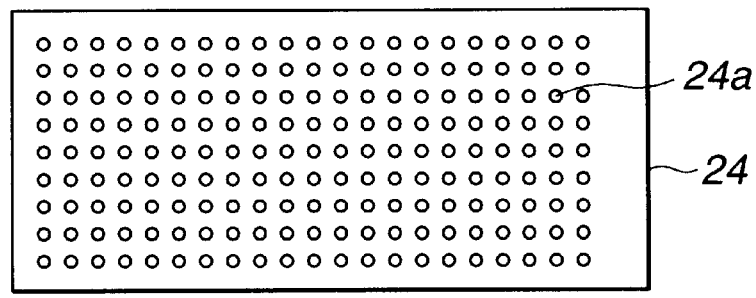
FIG. 7 is a plan view of the re-flow panel in the soldering apparatus of FIG. 4.

Of these figures, FIG. 5 is an enlarged cross-sectional view showing the a re-flow unit of the soldering apparatus of FIGS. 1 to 4, looking along a direction transverse to the substrate transporting direction, FIG. 6 is an enlarged cross-sectional view of the re-flow unit of the soldering apparatus of FIG. 4, looking along the substrate transporting direction and FIG. 7 is a plan view of the re-flow panel in the soldering apparatus of FIG. 4.

Referring to FIGS. 4 and 5, the re-flow unit 12 includes a heating means 12A and a cooling means 12B. The heating means 12A and the cooling means 12B are arranged below and above the conveyor 16, respectively, The heating means 12A is made up of a re-flow heater 20 and in more detail is made up of a lower heater 21, an upper heater 22, a fan 23, and re-flow panel 24.

As shown in FIG. 6, the lower heater 21 and the upper heater 22 are provided with plural holes 21a, 22a, respectively. The fan 23 is arranged on the lower lateral sides of the lower heater 21 and the upper heater 22. The re-flow panel 24 includes plural panel holes 24a, as shown in FIG. 7.

The heating means 12A, described above, is configured for being driven by the sirocco fan 23 to take in ambient air in the direction indicated by arrow H to route it to the lower side of the lower heater 21 of the re-flow heater 20, with the ambient air being sequentially passed through the holes 21a, 22a of the lower heater 21 and the upper heater 22 so as to be evenly blown onto the soldering surface of the printed wired board P as hot wind HW of the pre-set temperature.

The cooling means 12B includes a casing 25, exhaust ducts 26 and an exhaust pipe 27, as shown in FIGS. 5 and 6. Centrally of the casing 25 is formed an opening 25a surrounded by shielding plates 25b, 25b of, e.g., glass.

The exhaust ducts 26 are provided on both sides of the casing 25. The exhaust pipe 27 is mounted on the sirocco fan 23, as shown in FIG. 6.

The cooling means 12B, described above, is configured for being driven by a suction blower 28 to take in ambient air in the direction indicated by arrow C via opening 25a into the casing 25 to route it along the loading surface of the printed wired board P carrying the non-heat-resistant electronic parts to route it through the exhaust pipe 27 again to the re-flow heater 20 from the sirocco fan 23, as shown in the enlarged side view of FIG. 4.

The structure of the cooling unit 14 is hereinafter explained.

The cooling unit 14 includes a suction cooling system 14A and a cooling fan 14B. The suction cooling system 14A and the cooling fan 14B are arranged above and below the conveyor 16, respectively.

Figure 8:
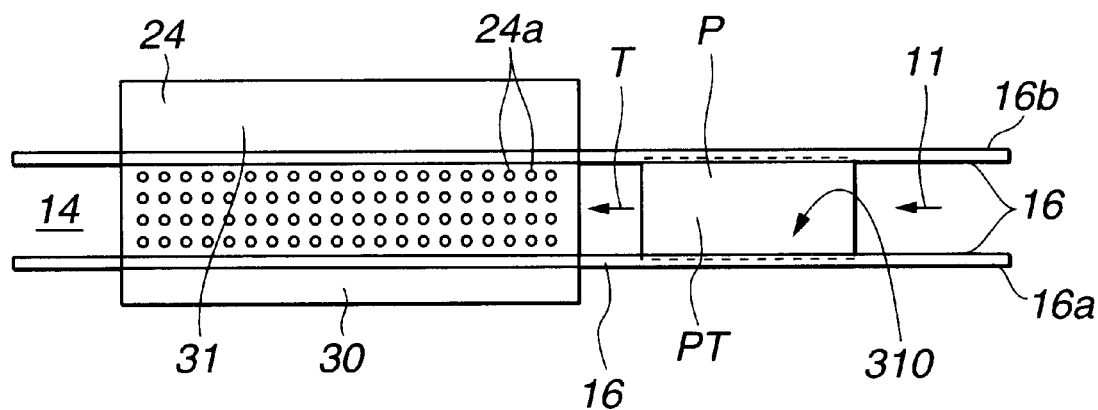
FIG. 8 is a schematic plan view showing relative positions between the re-flow panel in the soldering apparatus of FIG. 4 and a conveyor.
Figure 9A:
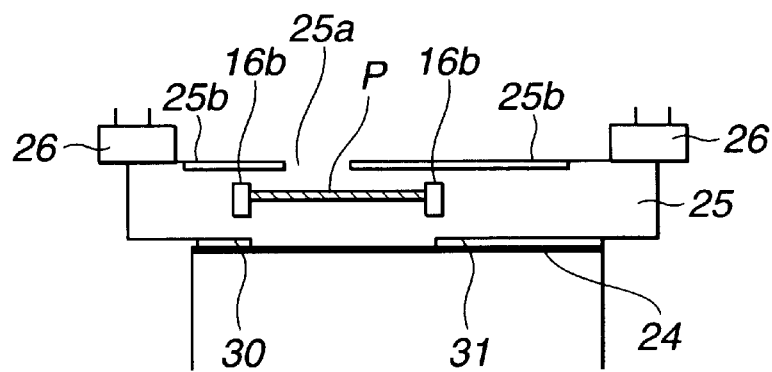
FIG. 9A is a cross-sectional view showing an tight contact cover of the re-flow panel in the soldering apparatus of FIG. 4.
Figure 9B:
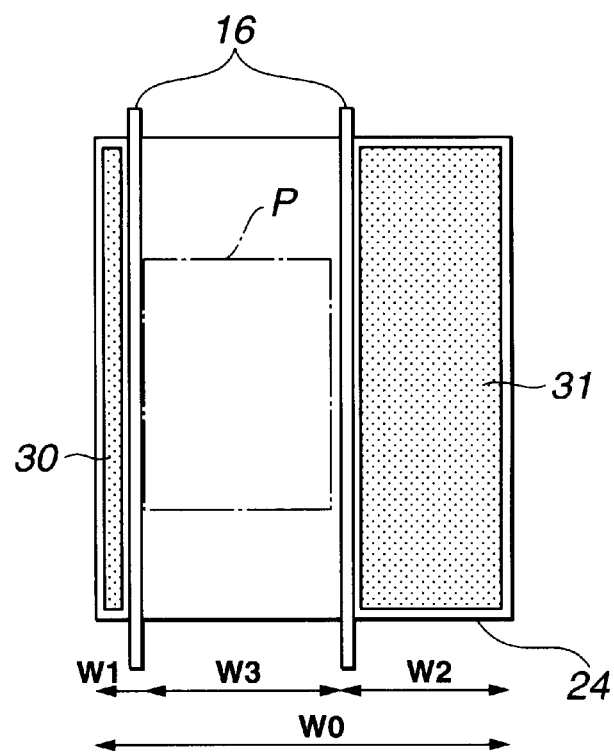
FIG. 9B is a plan view showing an tight contact cover of the re-flow panel in the soldering apparatus of FIG. 4.

It is noted that the re-flow panel 24 is arranged relative to the printed wired board P transported by the conveyor 16, as shown in FIGS. 8 and 9. FIG. 8 is a schematic plan view showing relative positions between the re-flow panel in the soldering apparatus of FIG. 4 and a conveyor, whilst FIG. 9A is a cross-sectional view showing a tight contact cover of the re-flow panel in the soldering apparatus of FIG. 4 and FIG. 9B is a plan view showing a tight contact cover of the re-flow panel in the soldering apparatus of FIG. 4.

That is, the re-flow panel 24 is protruded relative to the conveyor 16 by a width W1 on the front side and by a width W2 on the back side, as shown in FIG. 9B. So, the portion of the re-flow panel 24 corresponding to a center width W3 of the entire width W0 faces the printed wired board P transported by the conveyor 16 to contribute to the heating of the part soldering surface of the printed wired board P.

On the other hand, the re-flow panel 24 is provided with tight contact covers 30, 31 on the upper surfaces of the portions thereof protruded from both sides of the conveyor 16 (non-used portions).

Of these tight contact covers 30, 31, the front side tight contact cover 30 is fixed relative to the re-flow panel, because the front side conveyor 16a is fixed.

The rear side tight contact cover 31 is mounted for position adjustment relative to the re-flow panel 24 in the fore-and-aft direction, that is in the left-and-right direction in FIG. 9, because the back side conveyor 16b can be adjusted in its position depending on the width of the printed wired board P.

By not forming the holes 24a of the re-flow panel 24 partially, it is possible not to provide the tight contact cover 30.

In the above-described structure of the soldering apparatus 1 according to the present invention, the method for performing the soldering processing using this soldering apparatus 1 is explained with reference to FIG. 10.

Referring to FIG. 10A, chip parts 201, 202, as heat-resistant electronic parts, are already mounted on an upper surface (first surface) 310 of the printed wired board P by re-flow soldering. To a lead land of the upper surface 310 of the printed wired board P, a cream solder 300 is applied, using a multiple dispenser (nozzle) 301. Then, as shown in FIG. 10B, the printed wired board P is inverted upside down and lead parts 101, 102, 103 and 104, as non-heat-resistant electronic parts, are mounted on the upper surface (second surface) 320 of the printed wired board P.

The printed wired board P then is placed on an inlet part 11 of the conveyor 16 of FIG. 4, with the lead parts 101 to 104 lying on the upper side, and is transported in a direction T. The first pre-heating unit 10A, second pre-heating unit 10B and the third pre-heating unit 10C of the pre-heating unit 10 are actuated to raise the temperature of the printed wired board P gradually from ambient temperature to the pre-set temperature. This relieves the stress of the printed wired board P and the electronic parts loaded thereon while activating the cream solder 300.

The heating means 12A of the re-flow unit 12 then is actuated to eject a hot wind HW to the lower surface 310 of the printed wired board P, that is to the part soldering surface, to heat and fuse the cream solder 300 whilst the cooling means 12B also is actuated to direct a cold wind to the upper surface 320, that is to the part loading surface, to cool the lead parts 101 to 104, as shown in FIG. 10D. In this manner, the cream solder 300 is rendered compatible with the space between the connection terminals of the lead parts 101 to 104 and the wiring conductor of the printed wired board P, while it is possible to prevent damage of the lead parts 101 to 104 by thermal hysteresis.

Since the tight contact covers 30, 31 are kept in intimate contact with the unused portions of the re-flow panel 24, the holes 24a of the unused portions are closed by the tight contact covers 30, 31 to prohibit the hot wind HW from being ejected from the unused portions of the re-flow panel 24. Since the hot wind HW is not turned around to a part loading surface 320 of the printed wired board P, there is no risk of the lead parts 101 to 104 being heated by the hot wind HW thus preventing the part from being affected from being lowered in reliability while diminishing the loss of the thermal energy. Since this improves the heating efficiency of the printed wired board P by the re-flow panel 24, there is no risk of the occurrence of power shortage even if the printed wired board P is to be subjected to a high thermal load as in case the printed wired board is comprised of the tuner circuit of the high frequency device for TV receiver and an IF circuit, with the result that the part soldering surface of the printed wired board is heated sufficiently to assure reliable soldering.

The cooling fan 14B of the cooling unit 14 then is actuated to route the cold wind to the part soldering surface 310 to cool and cure the cream solder 300 to solder the connection terminals of the lead parts 101 to 104 in position, at the same time as the suction cooling system 14A is actuated to route the cool wind gradually to the part setting surface 320 to cool the lead parts 101 to 104.

This electrically connects the respective connection terminals of the lead parts 101 to 104 to the wiring conductors of the printed wired board P, while preventing the lead parts 101 to 104 from being damaged by remaining heat. That is, since the part setting surface 320 as well as the part soldering surface 310 is cooled by the cool wind in the cooling process, the part setting surface 320 can be instantly cooled even if the remaining heat from the part soldering surface 310 is transmitted to the part setting surface 320, thus preventing abnormal heating of the lead parts 101 to 104.

Meanwhile, in consecutively soldering plural printed wired boards P in the soldering operations shown in FIG. 10, a mid portion of the re-flow panel 24, that is its area facing the conveyor 16, is covered by the printed wired board P itself. However, on startup and termination of the soldering operations, there is no printed wired board P ahead or at back of the printed wired board P, so that the hot wind ejected from the holes 24a in the re-flow panel 24 is turned around towards the part setting surface which is the upper surface of the printed wired board P.

Figure 11:
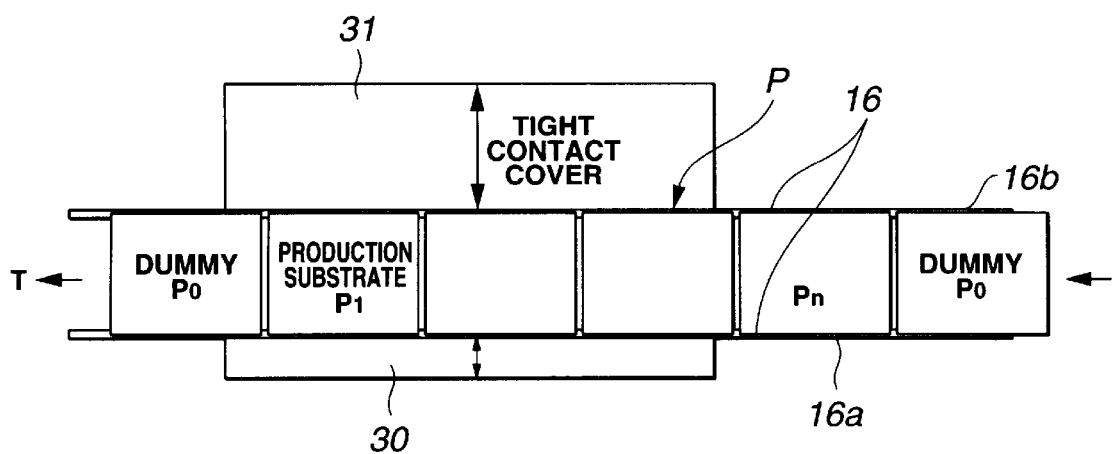
FIG. 11 is a schematic plan view showing the state of continuously soldering printed wired boards by the soldering apparatus of FIG. 4.

If, when consecutively soldering plural printed wired boards P in the soldering operations shown in FIG. 11, a dummy printed wired board P0 is arranged ahead of the first printed wired board P1 and at back of the last printed wired board Pn, as a standard operation, the area of the conveyors 16 is covered by the dummy printed wired board P0 in the course of the soldering operation for the printed wired board P1 or Pn thus preventing the hot wind HW from turning around to the part setting surface 320 thus preventing unusual heating of the lead parts 101 to 104.

That is, in the above-described embodiment, in which the holes of the re-flow panel of the re-flow unit other than those of the panel area facing the printed wired board to be soldered are tightly covered by the tight contact cover, the holes of the panel area not facing the printed wired board, that is the unused panel portion, are covered, thus prohibiting ejection from the re-flow panel of the hot wind not contributing to the heating of the part soldering surface of the printed wired board.

Since the hot wind is not turned around to the part setting surface side of the substrate, the loaded part is not heated by the hot wind to prevent the part from being lowered in reliability. On the other hand, the thermal energy loss is diminished to improve the board heating effect by the re-flow panel. Thus, even in such a case wherein a part subjected to significant thermal load, such as a printed wired board having comprised of a tuner circuit of the high frequency device for the TV receiver and an IF circuit, unified together, is loaded on a substrate, there is no risk of power shortage, such that the part soldering surface of the substrate is sufficiently heated to assure reliable soldering.

In the above-described embodiment, the pre-heating unit 10 is made of three stage heating portions, namely the first pre-heating unit 10A, second pre-heating unit 10B and the third pre-heating unit 10C. This is merely illustrative such that the pre-heating unit 10 may be made up of one, two, four or more heating units.

The re-flow unit 12 has a re-flow heater 20 comprised of two heaters, namely the upper heater 22 and the lower heater 21. This again is not limitative since the re-flow unit 12 may be provided with one or three or more re-flow heaters.

What is claimed is:

1. A soldering apparatus in which, for electrically connecting a non-heat-resistant part loaded on a substrate, a part soldering surface side of said substrate is heated by a re-flow unit, said soldering apparatus comprising:

a re-flow panel of said re-flow unit having holes for ejecting a hot wind towards a soldering surface of said substrate, and a tight contact cover intimately contacting said re-flow panel except a portion thereof facing the substrate to be soldered, whereby said cover includes a first cover portion fixed relative to the re-flow panel and a second cover portion mounted for positional adjustment relative to the re-flow panel.

2. The soldering apparatus according to claim 1 further comprising:

cooling means for cooling a side of said printed wired board carrying non-heat-resistant part.

3. The soldering apparatus according to claim 1 wherein there is provided a tight contact cover in an area facing said re-flow panel outside conveyors placed on both sides of said substrate, said tight contact cover tightly contacting said re-flow panel.

4. A soldering method in which a solder is coated on a substrate, said substrate is inverted upside down, a non-heat-resistant part is loaded on said substrate and a soldering surface for said part of said substrate is heated by a re-flow unit, said method comprising:

using a re-flow panel of said re-flow unit having holes through which a hot air is ejected towards said soldering surface of said substrate;

arranging a tight contact cover intimately contacting said re-flow panel except a portion of the re-flow panel facing the substrate to be soldered to prohibit ejection of said hot wind through said holes; and fixing a first cover portion of said cover relative to said re-flow panel and mounting a second cover portion of said cover for positional adjustment relative to the re-flow panel.

5. The soldering method according to claim 4 wherein a side of said printed wired board carrying non-heat-resistant parts is cooled by cooling means.

6. The soldering method according to claim 4 wherein, in an area facing said re-flow panel outside conveyors placed on both sides of said substrate, ejection of the hot wind through said holes is prohibited by a tight contact cover tightly contacting the re-flow panel.

7. The soldering method according to claim 6 wherein a leading dummy printed wired board, a plurality of printed wired boards and a trailing dummy printed wired board are moved in succession on said conveyor to prevent ejection of the hot wind through gaps between the dummy printed wired board, plural printed wired boards and the trailing dummy printed wired board.

8. A soldering method in which a solder is coated on a substrate, said substrate is inverted upside down, a non-heat-resistant part is loaded on said substrate and a soldering surface for said part of said substrate is heated by a re-flow unit, said method comprising:

using a re-flow panel of said re-flow unit having holes through which a hot air is ejected towards said soldering surface of said substrate;

arranging a tight contact cover intimately contacting said re-flow panel except a portion of the re-flow panel facing the substrate to be soldered to prohibit ejection of said hot wind through said holes; and wherein in an area facing said re-flow panel wherein outside conveyors placed on both sides of said substrate, ejection of the hot air through said holes is prohibited by the tight contact cover tightly contacting the re-flow panel; and wherein a leading dummy printed wired board, a plurality of printed wired boards and a trailing dummy printed wired board are moved in succession on said conveyor to prevent ejection of the hot air through gaps between the dummy printed wired board, plural printed wired boards and the trailing dummy printed wired board.

* * * * *